United States Patent [19]

Suarez

[11] Patent Number: 5,175,884
[45] Date of Patent: Dec. 29, 1992

[54] VOLTAGE CONTROLLED OSCILLATOR WITH CURRENT CONTROL

[75] Inventor: Jose I. Suarez, Coral Gables, Fla.

[73] Assignee: Motorola, Inc., Schaumburg, Ill.

[21] Appl. No.: 531,668

[22] Filed: Jun. 1, 1990

[51] Int. Cl.⁵ .......................... H04B 1/06; H03G 3/20
[52] U.S. Cl. ................... 455/260; 455/264; 331/44; 331/177 R; 331/177 V
[58] Field of Search .............. 455/76, 260, 264; 331/25, 35, 96, 44, 177 R, 177 V

[56] References Cited

U.S. PATENT DOCUMENTS

| | | | |
|---|---|---|---|
| 4,630,006 | 12/1986 | Anderson | 331/177 R |
| 4,692,717 | 9/1987 | Ouyang et al. | 331/177 R |
| 4,746,879 | 5/1988 | Ma et al. | 331/176 |
| 4,931,750 | 6/1990 | Gontowski | 331/177 R |
| 5,019,791 | 5/1991 | Cohen | 331/96 |
| 5,027,429 | 6/1991 | Kosima | 455/264 |
| 5,063,387 | 11/1991 | Mower | 455/260 |
| 5,097,228 | 3/1992 | McJunkin | 331/177 V |
| 5,105,169 | 4/1992 | Yamazaki et al. | 331/177 R |

Primary Examiner—Reinhard J. Eisenzopf
Assistant Examiner—Timothy H. Keough
Attorney, Agent, or Firm—Daniel K. Nichols

[57] ABSTRACT

An apparatus (200) and method for adjusting the bias current of the oscillating device (320) in a VCO (202) in response to changes in the tuning voltage of the VCO to achieve reduced sideband noise.

12 Claims, 4 Drawing Sheets

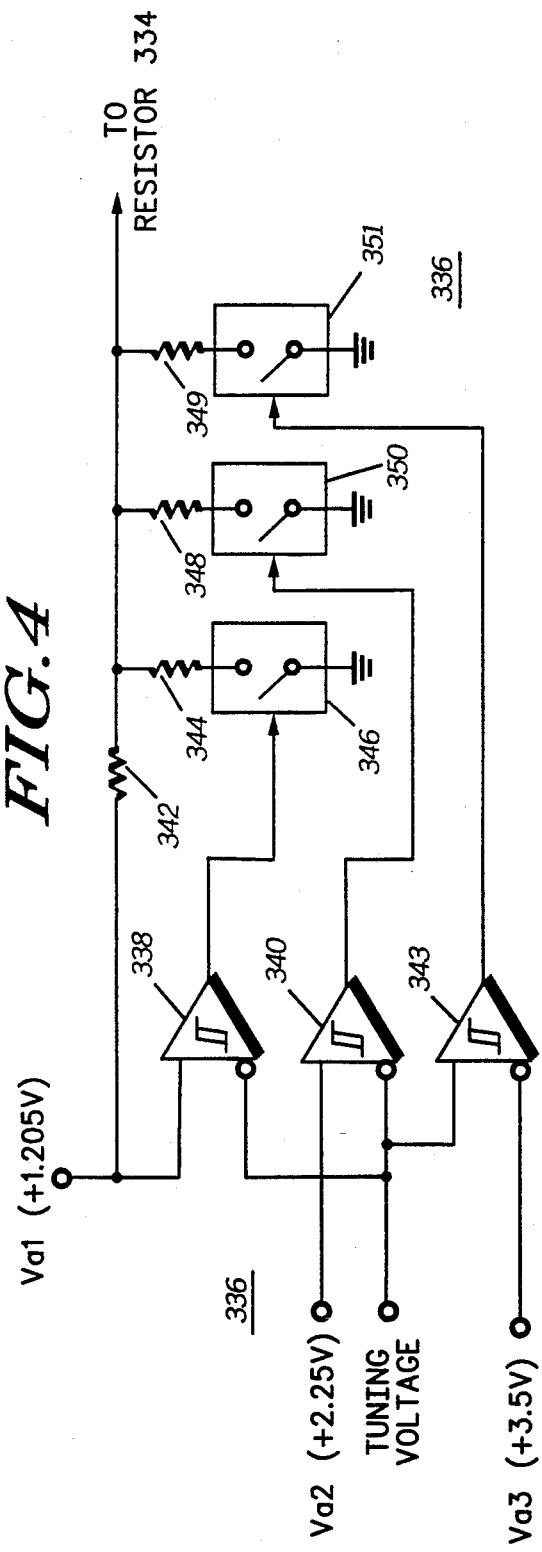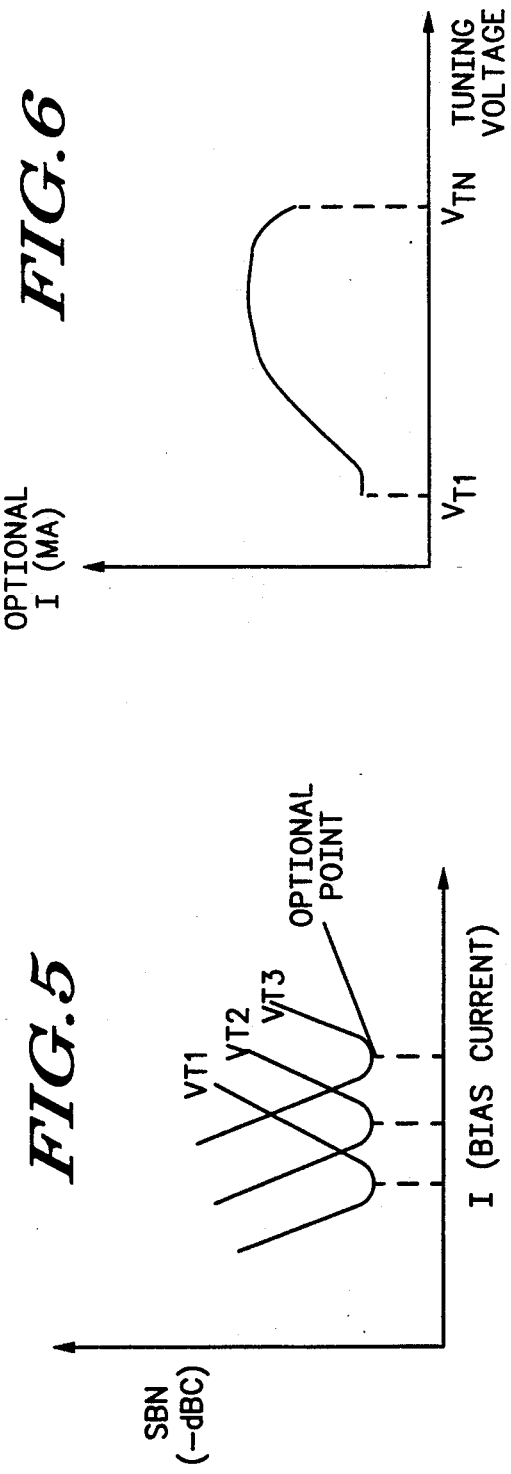

VOLTAGE CONTROLLED OSCILLATOR WITH CURRENT CONTROL

TECHNICAL FIELD

This invention relates generally to electronic communication devices, and more specifically to voltage controlled oscillators (VCOs).

BACKGROUND

It has been observed in varactor voltage controlled oscillator circuits that sideband noise (SBN) varies with the current and varactor tuning voltage of the oscillating device. For each tuning voltage of a VCO (for a given varactor capacitor and Q) there is an optimal VCO bias current that minimizes SBN. However, conventional VCOs used in phase locked loops suffer SBN performance degradation, as the tuning voltage varies, because in present circuits the VCO bias current is fixed. Therefore, a need exists for VCOs that are able to automatically adjust the bias current to compensate for SBN degradation caused by tuning voltage change.

SUMMARY OF THE INVENTION

Accordingly, it is an object of the present invention to overcome the detriments and limitations of the prior art.

Briefly, according to the invention, the optimum levels of bias currents of the oscillating device of a VCO, for obtaining minimum SBN, are measured over a specified range of tuning voltages. The data resulting from such measurements is used to control the bias current.

BRIEF DESCRIPTION OF THE DRAWINGS

FIG. 4 shows an example of a shaping circuit for used in conjunction with the present invention.

FIG. 5 shows a graphical representation of SBN variation over a range of device currents, given a plurality of tuning voltages, over the design range $V_{T1}$ to $V_{TN}$.

FIG. 6 shows a graphical representation of VCO optimum bias current variation over the desired range of tuning voltages. These bias points correspond to minimized SBN as shown on FIG. 5.

DETAILED DESCRIPTION OF THE PREFERRED EMBODIMENT

Figure 1:
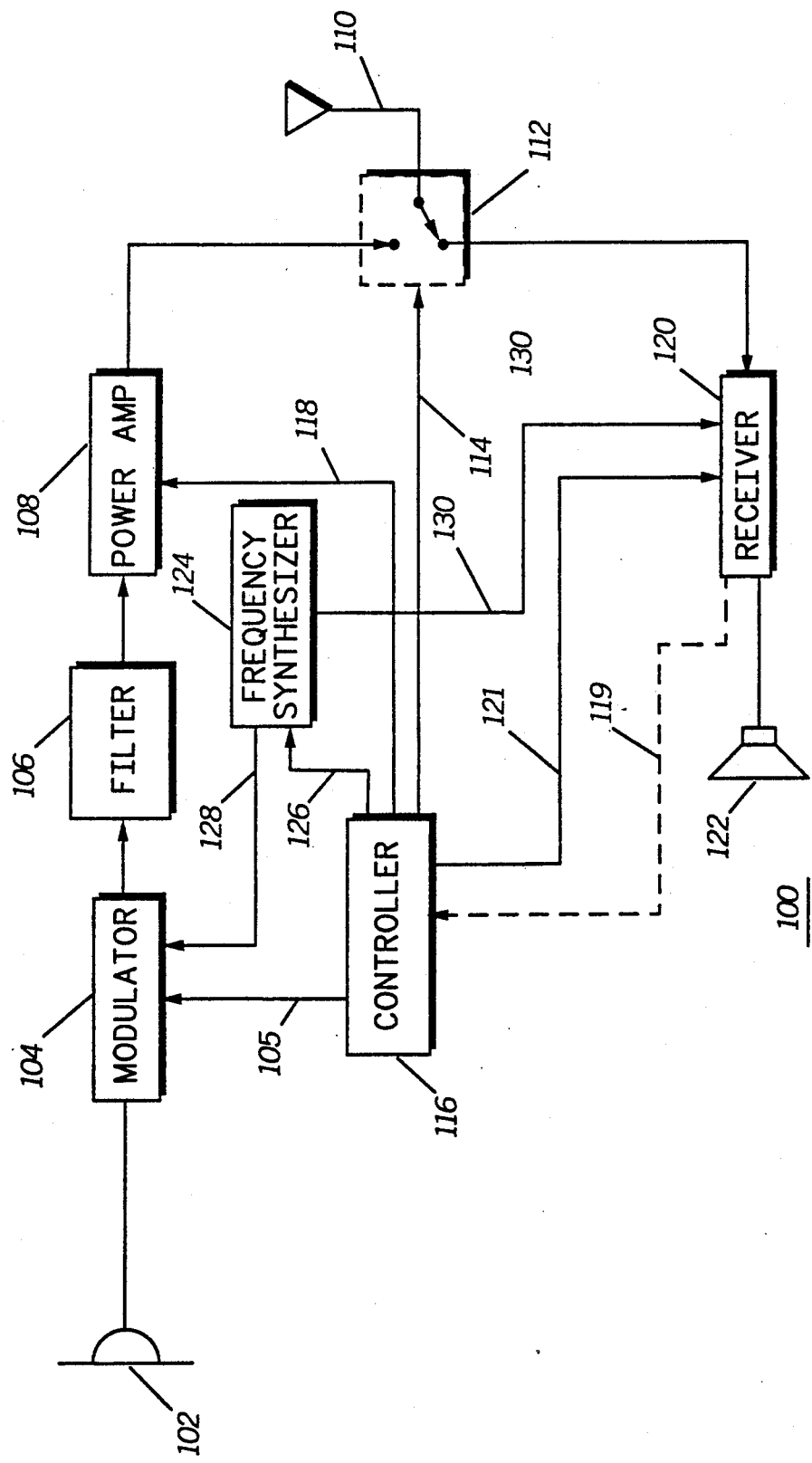
FIG. 1 shows a block diagram of a radio in which the invention may be used.

Referring to FIG. 1, a radio 100 is shown in which the invention may be advantageously used. An audio signal applied to the microphone 102 is modulated by a conventional modulator 104. The modulator 102 requires a source of radio-frequency signals to convert the audio signal to produce a radio-frequency signal may be provided by the frequency synthesizer 124. Reduced SBN is desirable for quality transmission and best receiver performance. A controller 116 (such as a conventional microprocessor) controls the modulator 104 and the frequency synthesizer 124. The modulated signal provided by the oscillator must be filtered by filter 106 to remove components of the signal having unwanted frequencies. Finally, the power amplifier 108 amplifies the filtered signal for transmission by antenna 110, when the switch 112 is in the "transmit" position.

When the switch 112 is in the "receive" position, RF signals received by the antenna 110 must be demodulated to audio frequency by the receiver 120 (which may be controlled by the controller 116). As in the case of the receiver, a source of RF signals having a precisely controlled frequency is required (for demodulation, in this case). The frequency synthesizer 124 provides such a signal. Once the received RF signal is demodulated, the resulting audio signal may be presented to a listener by the speaker 122.

Figure 2:
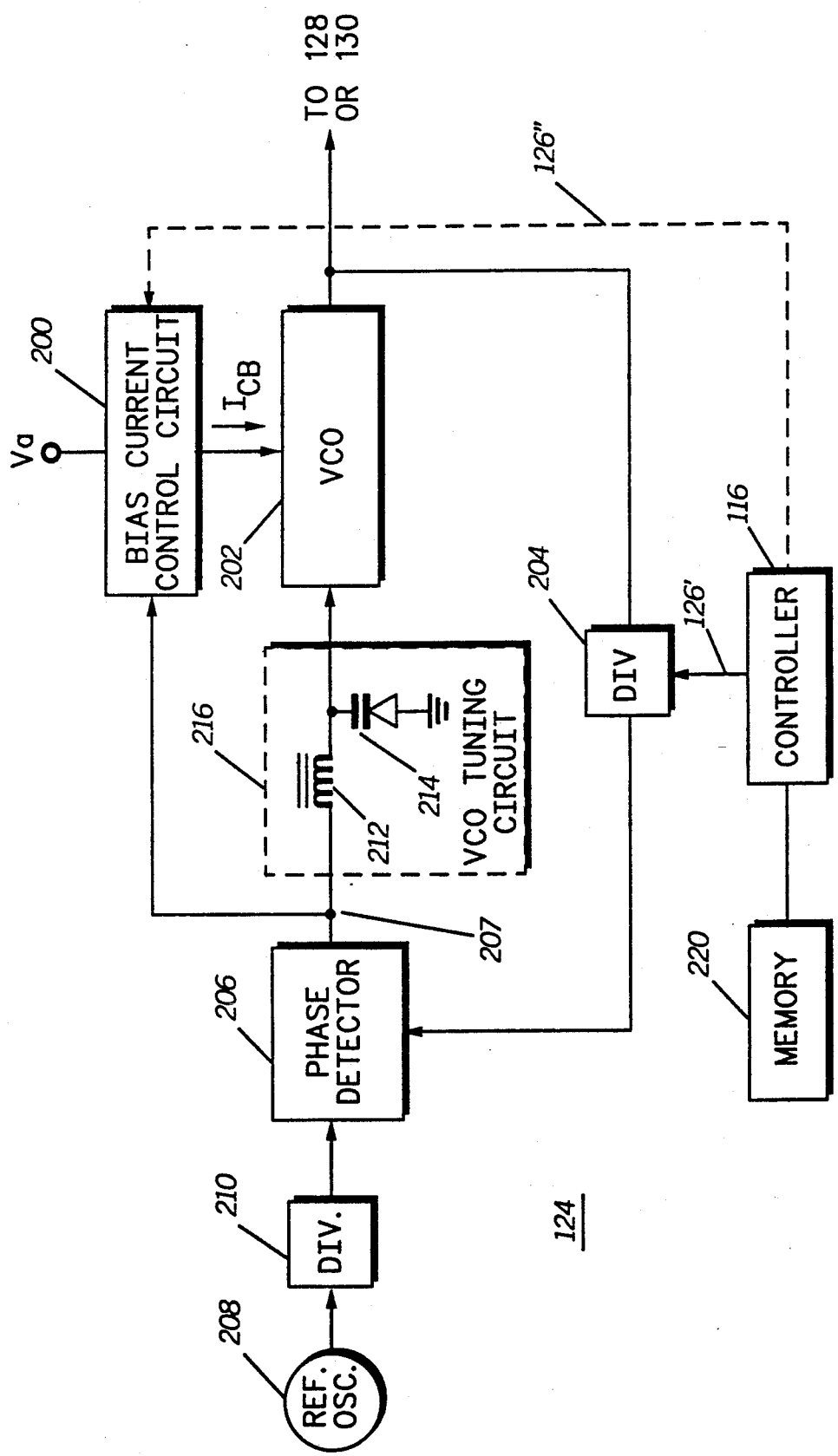
FIG. 2 shows a block diagram of a frequency synthesizer utilizing the invention.

Referring to FIG. 2, the frequency synthesizer 124 of FIG. 1 is shown in block-diagram form. A VCO 202 provides an output signal to lines 128 or 130 (shown in FIG. 1). The VCO output is frequency divided by divider 204 (the programmed divider count is controlled by controller 116). A reference oscillator 208 produces a signal having a reference frequency. That frequency is divided by divider 210 and provided to a phase detector 206. The phase detector 206 determines the difference in frequency and phase between the divided reference signal and the divided VCO signal. The output of the phase detector 206 in the steady state, is a DC voltage representative of the detected phase difference. That DC voltage is applied to the VCO 202 through a conventional frequency tuning circuit 216 comprising a choke 212 and a varactor 214 (normally, this is shown as part of the VCO). The VCO 202 will oscillate at a frequency equal to that of reference oscillator 208 multiplied by ratio of divider counter 204 to counter 210.

The operation of the frequency synthesizer 124 that has been discussed above is conventional. The SBN performance of the VCO 202 is improved, according to the invention, by introducing a DC bias current control circuit 200. The bias control circuit 200 senses the varactor tuning voltage at node 207 and produces either a voltage or a current control signal, which sets the bias current ($I_{bias}$) of the oscillator device 320 (shown in FIG. 3). In addition, the bias circuit 200 has as inputs a reference voltage (or a set of reference voltages.)

Alternatively, still referring to FIG. 2, a binary data representation of the $I_{bias}$ control signal required, for each of a plurality of tuning voltages, can be stored in memory 220, and used as input to bias circuit 200. The controller 116 programs divider 204 via data bus 126, and therefore the information pertaining to which of the plurality of tuning voltages corresponds to a given binary data representation is implicit. Controller 116 therefore provides circuit 200 with the proper binary data. The data bus 126 includes connections 126' and 126". Connection 126" may be omitted from the frequency synthesizer circuit 124 in an analog version of circuit 200.

Referring to FIG. 5, the values of oscillator device bias current are determined by measuring SBN versus the bias current, for a plurality of tuning voltages ($V_{T1}$ to $V_{TN}$, where $V_{TN} > V_{T4} > V_{T3} > V_{T2} > V_{T1}$). The optimum value of bias current is determined by the reading the current values corresponding to the minima of the curves. FIG. 6 represents a typical plot of the current at the minima versus the tuning voltage. For a binary representation, the relative width and overlap of the minima of the curves in FIG. 5, sets how many values must be selected (i.e., how many values in the plurality of tuning voltages, to ensure a certain maximum SBN). For an analog implementation, a suitable approximation to the curve in FIG. 6 is required, and this function may be implemented by the bias current control circuit 200.

Figure 3:
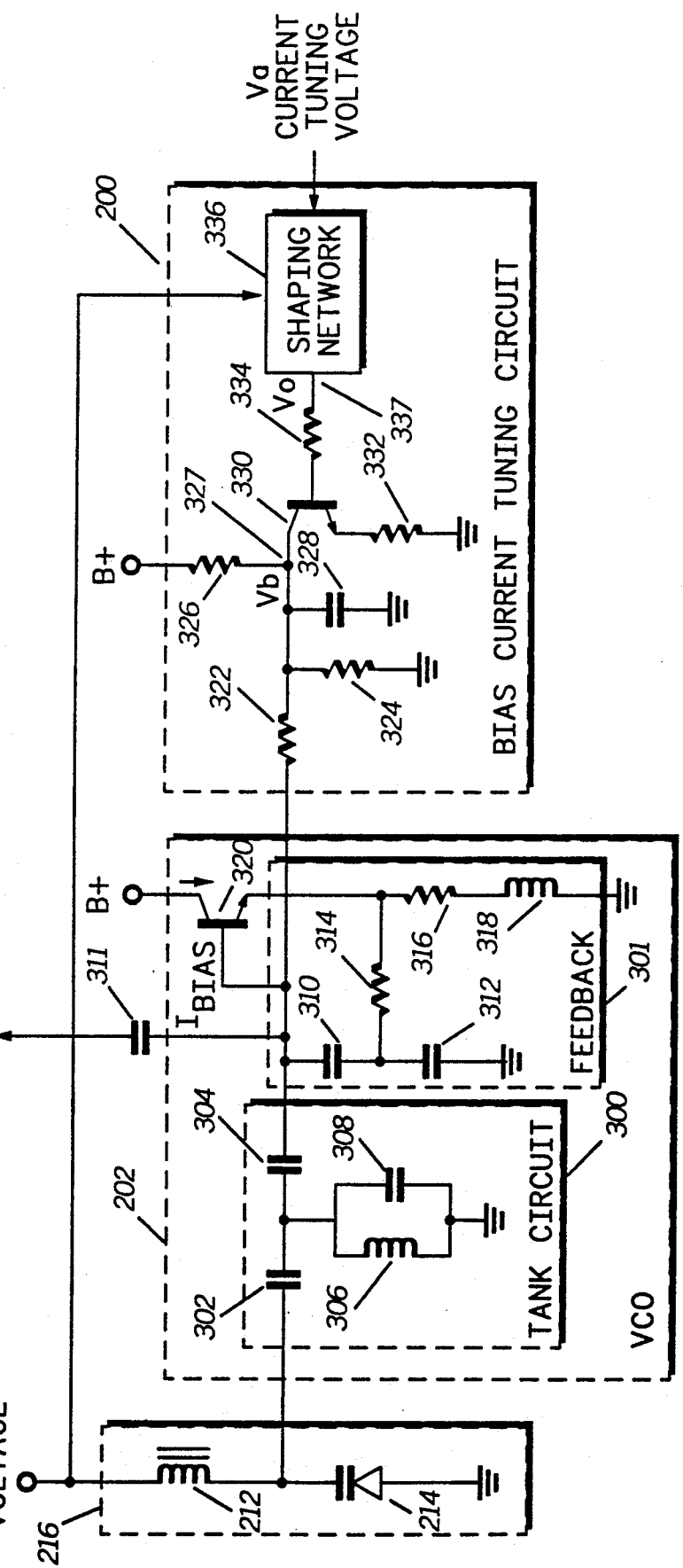
FIG. 3 shows a circuit for optimizing the VCO bias current for superior SBN performance over over a range of tuning voltages.

Referring to FIG. 3, possible circuits corresponding to the bias current control circuit 200 and the VCO are shown. The capacitors 302, 304, and 308, and the inductor 306 are connected together in a well-known tank circuit 300 configuration. The transistor 320 is the oscillating device in the VCO 202. The D.C. collector-to-emitter current in the transistor 320 is the bias current of the VCO. A feedback network 301 is disposed between the base and the emitter of the transistor 320 so that the VCO 202 can oscillate. The feedback network 301 comprises capacitors 310 and 312, resistors 314 and 316, and inductor 318 all coupled in a manner that is conventional for such circuits. Selection of values for the components in the circuits 300 and 301 is a matter of design choice depending on the oscillation frequency and circuit Q required.

The bias current circuit 200 may be implemented by the circuit shown in FIG. 3. The base of the transistor 320 is coupled to a resistor 322 to isolate circuit 200 from the RF signals of the VCO 202 The base of the transistor 320 is also coupled to line 128 or 130 through a coupling capacitor 311. The supply voltage (B+) is coupled to the collector electrode 319 of the oscillating transistor 320. The bias current of oscillator device 320 is set by the voltage ($V_b$) at node 327 and resistor 316. The voltage at node 327 is, in turn, set and controlled by resistors 326, 324 and 332 and the current in transistor device 330, in response to control voltage Vo measured at node 337 (which is the output of shaping circuit 336). In this sense, circuit 200 is a voltage-to-voltage converter. A voltage-to-current converter (with appropriate changes to the bias network of device 320) is also suitable for that purpose. As discussed with respect to FIG. 28 the shaping network 336 senses the tuning voltage and provides an output signal for driving the transistor 330. A constant current control voltage is provided to power the shaping network 336.

Referring to FIG. 4, a hard-wired analog implementation of the shaping network 336 which implements the functionality shown in FIG. 6, is shown. The VCO tuning voltage sensed by the shaping network is applied to a first comparator 338 at an inverting input, to be compared with a fixed reference voltage Va1 (e.g., 1.205 volts. A second comparator 340 also receives the sensed tuning voltage at an inverting terminal, for comparison with a second fixed reference voltage Va2 (e.g., 2.25 volts). A third comparator 343 receives reference voltage Va3 (e.g. 3.5 volts) at an inverting input and the sensed tuning voltage at the other input. The outputs of the first and second comparators (340 and 338) are applied to corresponding switches 346 and 350 so that when the inverting input of a comparator is lower than its other input, the output of that comparator goes high and the corresponding switch closes. Hysteresis may be provided to the comparators to aid in rejecting spurious signals present in the tuning voltage (node 207). When the output of a comparator goes low, the corresponding switch opens. A third resistor 349 is disposed between the output of circuit 336 and a third switch 351. The level of the voltage output ($v_o$) is determined by which of the switches are closed. The output voltage ($v_o$) is set (in response to the sensed tuning voltage) by appropriately selecting the values of the resistors 342, 344, 348, and 349 and the values of comparator input voltages, Va1, Va2, and Va3. More comparators must be added if greater resolution is required. It should be appreciated that the same results may be obtained by storing pairs of tuning voltages and their corresponding voltages $V_o$ (for optimum SBN performance) in a memory (or storage) means that may be accessed and controlled by control means such as a microprocessor, in which case the shaping network 336 becomes a digital-to-analog converter (DAC), the output of which is voltage $V_o$.

Referring to FIG. 6, a plot of the optimal VCO bias current (in milliamps) versus VCO tuning voltage for optimum SBN performance is shown. These values may be determined by reference to the graph of FIG. 5. The number of tuning voltages represented by the curve of FIG. 6 is determined by the number of voltages sampled for generating the data of FIG. 5, which, in turn, depends on the width of the nulls of the curves in FIG. 5. Wider nulls require less voltages measured.

In addition to measuring the VCO tuning voltages and bias currents required for optimum SBN performance those measurements may be made for a plurality of other parameters such as operating temperatures and voltage supply to the VCO (voltage 319 in FIG. 3) for radios in which the invention is to be used. The data resulting from these additional measurements could be used for adjusting the VCO bias current in the manners discussed herein.

What is claimed is:

1. A circuit for setting a bias current of an oscillating device, the oscillating device having an output whose frequency is controlled by a tuning voltage, the circuit comprising:

sensing means, coupled to the oscillating device, for sensing the tuning voltage of the oscillating device; and control means, responsive to the sensed tuning voltage, for controlling the bias current of the oscillating device, by setting a current value according to predetermined data relating to bias currents for minimizing sideband noise for each of a plurality of tuning voltages.

2. The circuit of claim 1, wherein the control means comprises a plurality of comparators, each comparator for comparing one of a plurality of reference voltages with the tuning voltage and producing an output signal, the output signal controlling the bias current in accordance with the predetermined relationship between the bias current and the tuning voltage.

3. The circuit of claim 2, further comprising switching means, controlled by the control means, the switching means being coupled to receive the outputs of the plurality of comparators.

4. The circuit of claim 2 further comprising memory means, coupled to the control means, for storing the predetermined data and for providing the predetermined data to the control means.

5. The circuit of claim 3 wherein the predetermined data include optimum bias current values for minimizing sideband noise for a plurality of tuning voltages at a plurality of temperatures.

6. The circuit of claim 2 wherein the control means include a microprocessor.

7. A frequency synthesizer comprising:

a VCO, having a bias current and an output whose frequency is controlled by a tuning voltage;

sensing means for sensing the level of the tuning voltage; and control means for controlling the bias current, in response to the level of the tuning voltage, by setting a current value according to predetermined data relating to bias currents for minimizing sideband noise for each of a plurality of tuning voltages.

8. The frequency synthesizer of claim 7 further comprising memory means for storing a plurality of predetermined current values, and wherein the control means controls the bias current by selecting a current value from the memory means for minimizing sideband noise for a plurality of tuning voltages.

9. The frequency synthesizer of claim 8 wherein the control means includes a microprocessor.

10. A radio comprising:
   a VCO having a bias current and an output whose frequency is controlled by a tuning voltage;
   sensing means for sensing the level of the tuning voltage; and
   control means for controlling the bias current, in response to the level of the tuning voltage, by setting a current value according to predetermined data relating to bias currents for minimizing sideband noise for each of a plurality of tuning voltages.

11. The radio of claim 10 wherein the control means includes a microprocessor.

12. A method for controlling the bias current of a VCO comprising the steps of:
   (a) measuring sideband noise levels of a VCO corresponding to a plurality of bias currents and VCO tuning voltages to produce a set of bias current values that minimize the sideband noise for each of the plurality of VCO tuning voltages;
   (b) storing the set of current values and their corresponding VCO tuning voltages produced in step (a);
   (c) sensing the level of the tuning voltage of the VCO; and
   (d) adjusting the level of the bias current of the VCO to correspond to the bias current value stored in step (b) that corresponds to the sensed tuning voltage.

* * * * *

UNITED STATES PATENT AND TRADEMARK OFFICE
CERTIFICATE OF CORRECTION

PATENT NO. : 5,175,884
DATED : December 29, 1992
INVENTOR(S) : Jose I. Suarez

It is certified that error appears in the above-identified patent and that said Letters Patent is hereby corrected as shown below:

Column 6, claim 12, line 9, between "and" and "VCO" insert -- a plurality of --.

Signed and Sealed this

Fourteenth Day of June, 1994

Attest:

BRUCE LEHMAN

Attesting Officer     Commissioner of Patents and Trademarks